US006985016B2

(12) United States Patent
Chow et al.

(10) Patent No.: US 6,985,016 B2
(45) Date of Patent: Jan. 10, 2006

(54) PRECISION CLOSED LOOP DELAY LINE FOR WIDE FREQUENCY DATA RECOVERY

(75) Inventors: James Chow, Palo Alto, CA (US); Kenny Wen, San Jose, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/921,242

(22) Filed: Aug. 18, 2004

(65) Prior Publication Data

US 2005/0017774 A1 Jan. 27, 2005

Related U.S. Application Data

(63) Continuation of application No. 09/867,793, filed on May 29, 2001, now abandoned.

(51) Int. Cl.
*H03L 7/06* (2006.01)

(52) U.S. Cl. .................. 327/149; 327/153; 327/158; 327/162

(58) Field of Classification Search ......... 327/152–159, 327/147–150, 3, 7, 161–163; 375/374–376; 331/11, 18, 25, DIG. 2
See application file for complete search history.

(56) References Cited

U.S. PATENT DOCUMENTS

| | | | | |
|---|---|---|---|---|
| 5,097,489 A | * | 3/1992 | Tucci | 375/374 |
| 5,159,205 A | * | 10/1992 | Gorecki et al. | 327/150 |
| 5,432,827 A | | 7/1995 | Mader | |
| 5,463,337 A | * | 10/1995 | Leonowich | 327/158 |
| 5,487,093 A | | 1/1996 | Adresen et al. | |
| 5,744,991 A | * | 4/1998 | Jefferson et al. | 327/158 |
| 5,801,566 A | | 9/1998 | Tanaka | |
| 5,900,762 A | | 5/1999 | Ramakrishnan | |
| 5,923,715 A | | 7/1999 | Ono | |
| 5,926,047 A | * | 7/1999 | Harrison | 327/159 |
| 5,969,552 A | | 10/1999 | Lee et al. | |
| 6,131,168 A | * | 10/2000 | Krzyzkowski | 713/503 |
| 6,173,432 B1 | * | 1/2001 | Harrison | 716/1 |
| 6,208,183 B1 | * | 3/2001 | Li et al. | 327/161 |
| 6,215,364 B1 | * | 4/2001 | Hwang et al. | 331/57 |
| 6,292,521 B1 | | 9/2001 | Lai et al. | |
| 6,326,826 B1 | * | 12/2001 | Lee et al. | 327/161 |
| 6,342,796 B2 | | 1/2002 | Jung | |
| 6,346,838 B1 | * | 2/2002 | Hwang et al. | 327/156 |
| 6,539,072 B1 | | 3/2003 | Donnelly et al. | |
| 6,628,154 B2 | | 9/2003 | Fiscus | |

FOREIGN PATENT DOCUMENTS

| DE | 198 40 241 C | 3/2000 |
|---|---|---|
| EP | 0 342 626 A2 | 11/1989 |

OTHER PUBLICATIONS

Tanoi, S. et al. "A 250–622 MHz Deskew and Jitter–Suppressed Clock Buffer Using Two–Loop Architecture" IEICE Transactions on Electronics, vol. E79–C, No. 7, Jul. 1, 1996, pp. 898–904, XP000632343.

European Search Report dated Oct. 16, 2002 for European Application No. 02253738.

* cited by examiner

Primary Examiner—Kenneth B. Wells
Assistant Examiner—Hai L. Nguyen
(74) Attorney, Agent, or Firm—Stephen C. Bongini; Lisa K. Jorgenson

(57) ABSTRACT

A closed loop delay line system (700) includes a phase lock loop that provides a phase lock output signal (715). A delay line (702) includes a clock input, a delay line output, and a delay line bias input. A bias signal provided to the delay line bias input (727) adjusts the speed of the delay line (702). A phase detector (720) compares phase between a first timing signal input (704) and the delay line output (706). A bias adjust circuit (726) mixes the phase compare output signal (725) and the phase lock output signal (715) to provide a combination bias signal (727) to the delay line (702). Additionally, the relative timing position of strobe outputs (734) from the delay line (702) can be individually adjusted.

27 Claims, 8 Drawing Sheets

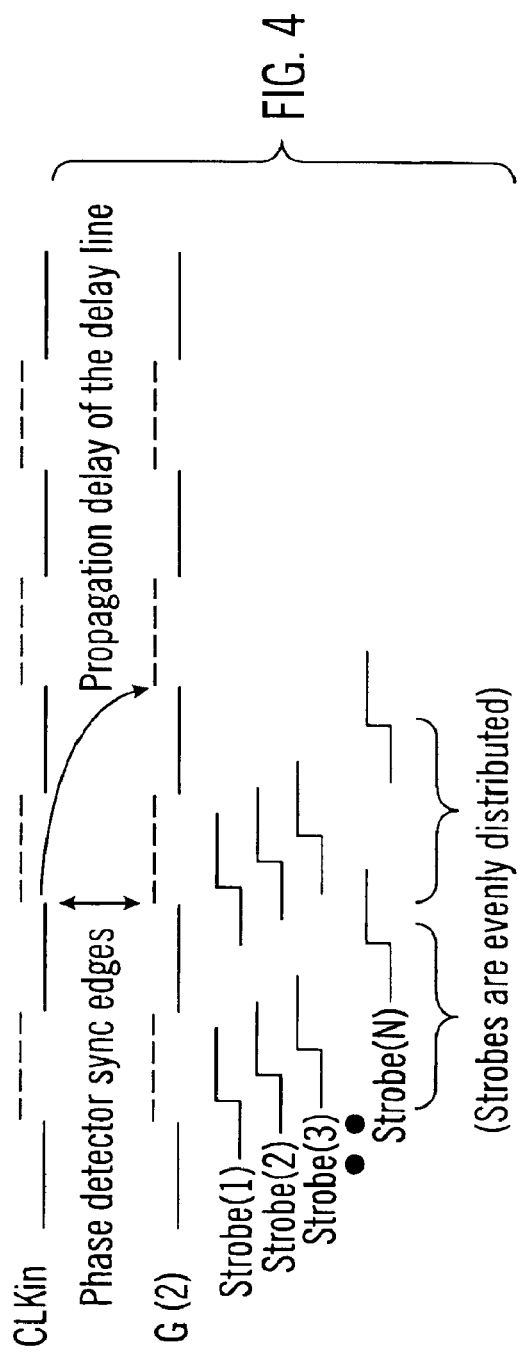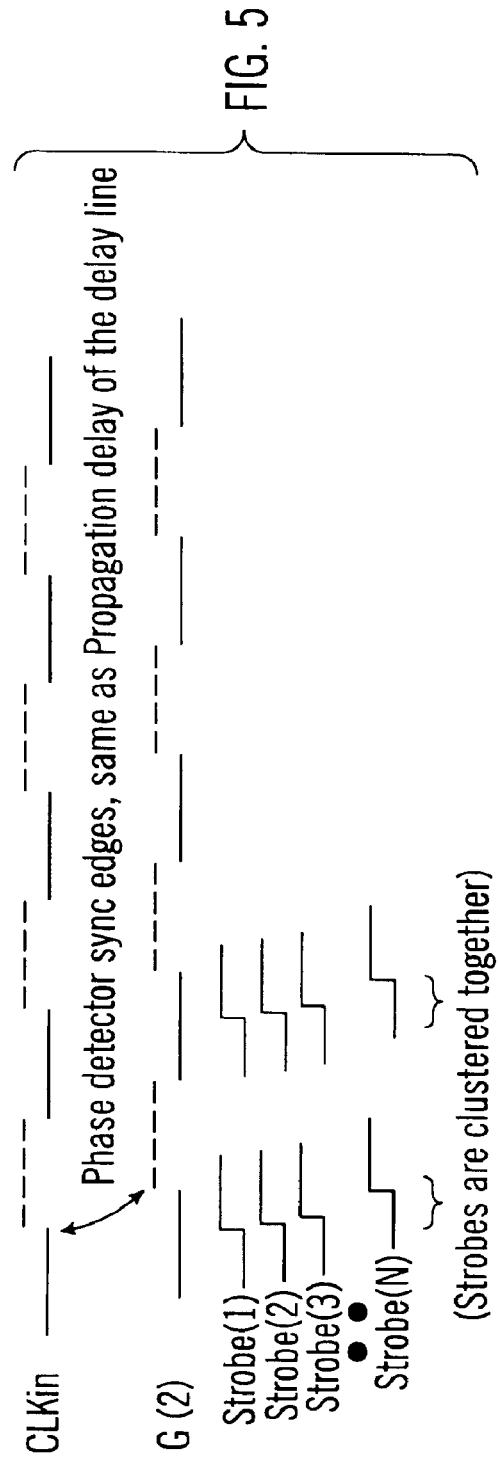

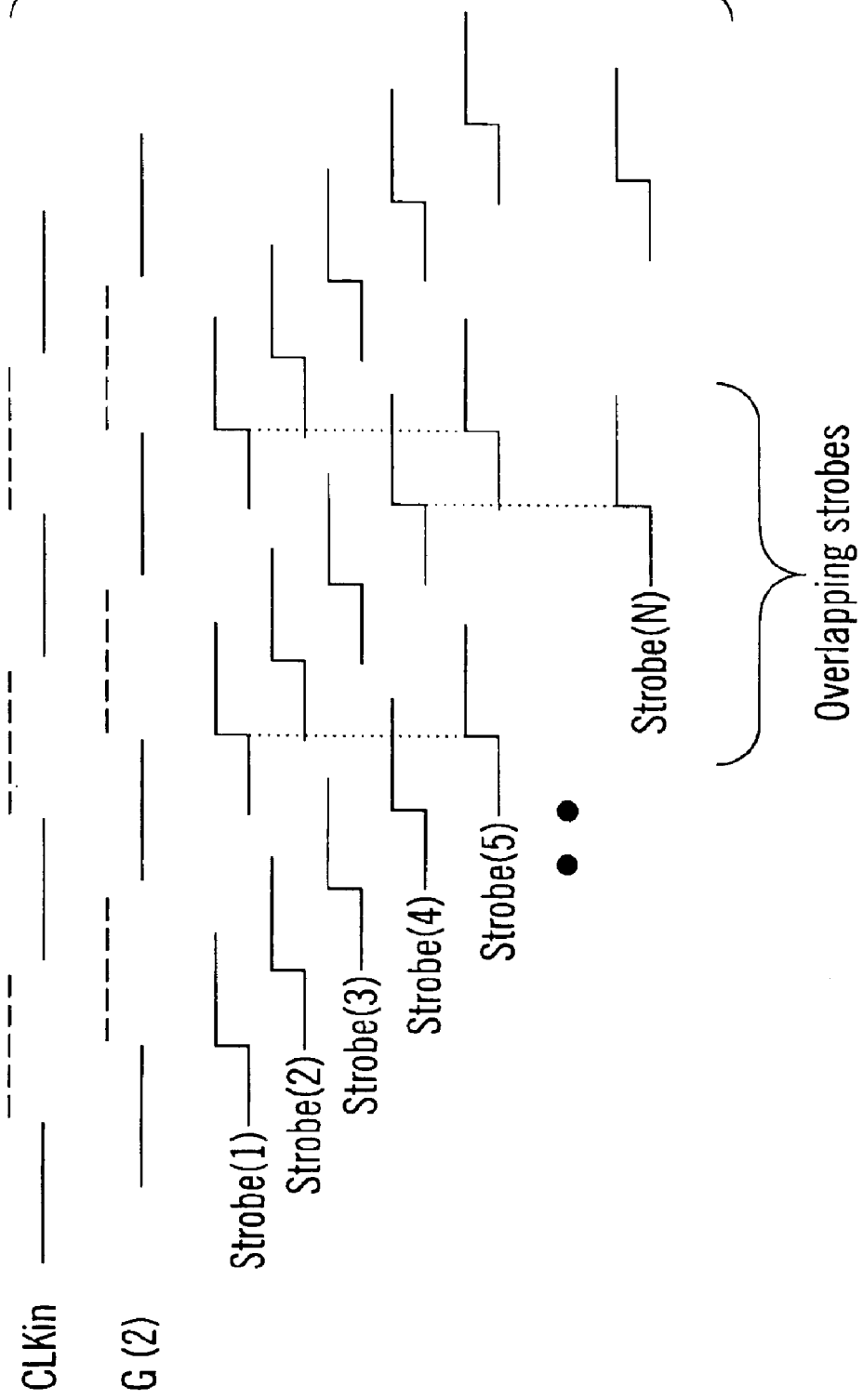

PRECISION CLOSED LOOP DELAY LINE FOR WIDE FREQUENCY DATA RECOVERY

CROSS-REFERENCE TO RELATED APPLICATION

This application is a continuation and claims priority from prior U.S. patent application Ser. No. 09/867,793, filed on May 29, 2001, now abandoned the entire disclosure of which is herein incorporated by reference.

BACKGROUND OF THE INVENTION

1. Field of the Invention

The present invention generally relates to delay line technology, and more particularly to a method and system utilizing a precision delay line. The invention can be applied in any system using timing signals, or data communication and transmission.

2. Description of the Prior Art

A variety of electronic devices, such as computers, monitors, flat panel displays, wireless communication devices, cellular phones, high speed two-way digital transceivers, and paging devices, to name just a few, utilize a plurality of timed signals, e.g., clock signals, vertical-synch and horizontal-synch signals, spread spectrum and digital wireless communication signals, etc., that are typically synchronized with other signals associated with such devices. A selectable delay circuit is commonly a key component of a synchronization function, such as may be part of a frequency synthesizer or a phase-locked loop circuit or other timed signal circuit. The propagation of timed electrical signals through transmission lines therefore sometimes calls for a selectable signal delay.

High precision adjustments in the frequency or phase of signal output from such synchronization function may depend on very expensive, custom analog circuit design and components. Additionally, such circuits often operate only within very narrow frequency ranges and can encounter inherent circuit startup problems or accuracy problems. This is especially problematic as the frequency of signals increases to operate with very high speed signaling circuits as found in modern devices, for example, such as radio frequency receiver circuits and transmitter circuits, and high speed clocking circuits, etc.

FIG. 1 illustrates a typical delay line 100 including delay elements 110, 114, 118, 122, 126. An input 102 provides a clock input signal to the delay line 100. An output 104 provides an output clock signal. Each of the delay elements 110, 114, 118, 122, 126, has an output electrically coupled to the next delay element stage and to a strobe output for the particular delay element. For example, see the output strobe lines 112, 116, 120, and 124. The timing of strobe (1) through strobe (N), 112, 116, 120, and 124, typically should be evenly distributed within a clock cycle from the input line 102 to the output line 104. A bias control circuit regulates the speed of the delay elements. A bias current input 106, in this example, provides the biasing current to regulate the speed of the delay elements 110, 114, 118, 122, 126. For an ideal condition, the phase difference between signal in 102 and signal out 104 is exactly one period. The delay line 100 normally has the advantage of high bandwidth and is a popular architecture for data recovery. As circuit designs push into higher clock frequency, many of the phase errors experienced in the conventional delay line 100 are no longer tolerable.

FIG. 2 shows a conventional open loop delay line architecture 200. A voltage controlled oscillator (VCO) 216 is used to set a delay line 202 propagation delay between a clock input 204 to a delay line output 206. The delay line 202 only has an input from CLK in 204 and the delay line output G(1) 206 is not fed back to the VCO 216 and control loop. A series of strobe output lines 218 provide strobe output signals Strobes(1:N). A phase and frequency detector (PFD) 208 has inputs from the CLK in 204 and from the VCO 216, but not from the delay line 202. The PFD 208 has output signals, at point H, electrically coupled to inputs of a Charge Pump circuit 210. The inputs control whether the Charge Pump 210 increases, or decreases, a voltage output, at point J. The voltage output signal of the Charge Pump 210 may contain A.C. ripple signals on top of a D.C. voltage signal. Therefore, a Filter 212, typically comprising a low pass filter, removes the A.C. ripple signals from the D.C. signal. The output of the Filter 212, at point K, is electrically coupled to the input of a Voltage-to-Current Converter 214. The output 215 of the Converter 214 is electrically coupled to an input of the VCO 216 to provide the closed loop feedback signal for the VCO 216. The output 215 of the Converter 214 is also electrically coupled to the Delay Line 202 to provide a Bias current input for the Delay Line 202. This Bias current regulates the speed of the speed of the delay elements, such as discussed earlier with respect to FIG. 1.

This circuit implementation 200 suffers from the following main disadvantages.

(1) Any mismatch between the VCO 216 and the delay line circuit 202 causes the strobe output signals from the strobe output lines 218 shift in timing positions and to lose data recovery accuracy. This is a major drawback relating to this delay line architecture 200.

(2) A mismatch within the delay line cells (i.e., between the delay line elements—such as shown in FIG. 1) causes a sampling shift between the delay line cells.

FIG. 3 shows a conventional closed loop delay line architecture 300. This circuit includes a conventional delay line 302 with delay line output G(2) 306 feeding into the input of a phase frequency detector (PFD) 308. The clock input 304 is electrically coupled an input of the delay line 302 and to an input of the PFD 308. The output of the PFD 308, at point H, is electrically coupled to the Charge Pump 310 and controls whether the voltage signal at the output of the Charge Pump 310, at point J, increases or decreases. This voltage signal, at point J, is fed through a Filter 312, preferably comprising a low pass filter, to remove ripple voltage signals from the voltage output signal from the Charge Pump 310. The filtered D.C. voltage signal from the Charge Pump 310, at point K, is electrically coupled to the input of a Voltage-to-Current Converter 314 to provide a corresponding current signal. This current signal at the output of the Voltage-to-Current Converter 314, at point L 315, is electrically coupled to the bias input of the Delay Line 302 to provide bias current to the delay line elements thereby controlling the speed of the delay line elements and corresponding strobe signal outputs at the strobe lines Strobes(1:N) 307. The speed of the delay line elements adjusts the time delay from the clock input 304 to the Delay Line signal output G(2) 306 through the delay line 302. This conventional closed loop delay line circuit implementation 300 suffers from the following disadvantages.

(1) As shown in FIGS. 4, 5, and 6, the timing diagrams illustrate potential start up problems that could cause a wrong edge to be used in the Phase Detector 308 for phase error reduction. Hence, the Phase Detector 308 can miss a strobe position window entirely. An additional digital circuit is needed to overcome this problem. This adds significant cost and additional real estate to an integrated circuit. Since integrated circuits are continuously under pressure for miniaturization and cost reduction, this disadvantage of the conventional circuit can be detrimental to commercial viability of an integrated circuit implementation.

(2) A phase error can be generated in the Phase Detector PFD 308 and the Charge Pump 310 thereby causing a strobe position shift problem. This is especially critical in wide frequency applications where accurate timing and phase must be maintained over a wide range of frequencies.

(3) The conventional closed loop delay line architecture 300 does not provide inter delay element mismatch compensation. This is especially problematic for a manufacturing process that must maintain very accurate matching of delay elements. Unfortunately, this increases the cost of manufacturing, for example, an integrated circuit and thereby reduces the commercial viability of an integrated circuit implementation.

FIGS. 4, 5, and 6, as discussed above, illustrate timing issues with the conventional closed loop delay line architecture. Specifically, for delay line architectures, the delay line output G could have the following two cases.

First, as shown in FIG. 2, the signal output G(1) 206 remains open. This open loop architecture experiences many problems as discussed above.

Second, as shown in FIG. 3, the signal output G(2) 306 is electrically coupled to the Phase Detector PFD 308 in a closed loop architecture 300. Three cases of signal timing will be briefly discussed in view of the closed loop architecture 300.

Case (1)—Ideal Correct Timing Maintained. (See FIG. 4)

G(2) output 306 is locking to the previous CLKin signal 304 clock edge. This provides one full clock period for the delay line 302 to generate correct strobes 307. This is the ideal condition. Unfortunately, actual circuit implementations can result in problems with attempting to provide evenly spaced strobe signals from the closed loop delay line architecture 300, as will be discussed below.

Case (2)—Incorrect Timing Due To Delay Line Too Fast. (See FIG. 5)

However, the Phase Detector PFD 308 could pick up transition edges for the same clock cycle for CLKin 304 & G(2) 306. As shown in FIG. 5, the Phase Locked Loop PLL 300, indicated by the circuit loop including circuit segments G(2) 306, H, J, K, and L 315, is trying to speed up the loop to reduce the CLKin 304 and the G(2) 306 phase error. This can not be achieved, unfortunately, since there are circuits involved in the delay line 302 compared to CLKin 304. It causes the Charge Pump 310 to pump the Filter voltage, at point K, to an upper voltage limit of VCC. The delay line strobes 307 therefore are not correctly setup.

Case (3)—Incorrect Timing Due To Delay Line Too Slow. (See FIG. 6)

On the other hand, the Phase Detector PFD 308 can lock at one-half, one-third, or one-fourth, of the input clock frequency at the clock input 304. This causes strobes 307 to overlap each other and consequently not be evenly distributed. This is a problem for maintaining accurately spaced strobe signal positions.

Accordingly, there exists a need for overcoming the disadvantages of the prior art as discussed above. Improved delay line circuit architectures in systems are necessary to meet the challenging requirements of modern high speed signaling implementations, such as operating over a wide frequency range, while responding to the continuous pressures for lower cost and smaller real estate for any circuit implementation.

SUMMARY OF THE INVENTION

According to a preferred embodiment of the present invention, an electronic system comprises:

a first timing signal input for receiving a first electronic timing signal;

a phase lock loop, electrically coupled to the first timing signal input, and providing a phase lock output signal indicative of a lock condition of the phase lock loop and the first electronic timing signal;

a delay line comprising a clock input, a delay line output, and a delay line bias input, a bias signal provided to the delay line bias input adjusting the speed of at least one delay line element in the delay line thereby adjusting the relative position of a timing output signal at the delay line output relative to a timing input signal at the clock input into the delay line;

a bias adjust circuit comprising a first bias input and a second bias input, the first and second bias inputs being mixed and electrically coupled to a bias output of the bias adjust circuit; and a phase detector circuit comprising first and second phase detection inputs and a phase detection output, the phase detector circuit outputting a phase compare output signal at the phase detection output that is based on the relative compared phase between signals at the first and second phase detection inputs, and wherein the first timing signal input and the delay line output are electrically coupled to the first and second phase detection inputs, and wherein the phase compare output signal is electrically coupled to the first bias input and the phase lock output signal is electrically coupled to the second bias input, the bias output of the bias adjust circuit being electrically coupled to the delay line bias input to provide a bias signal to the delay line.

BRIEF DESCRIPTION OF THE DRAWINGS

FIGS. 4, 5, and 6, which have already been described, show timing diagrams.

DESCRIPTION OF THE PREFERRED EMBODIMENTS

Figure 1:
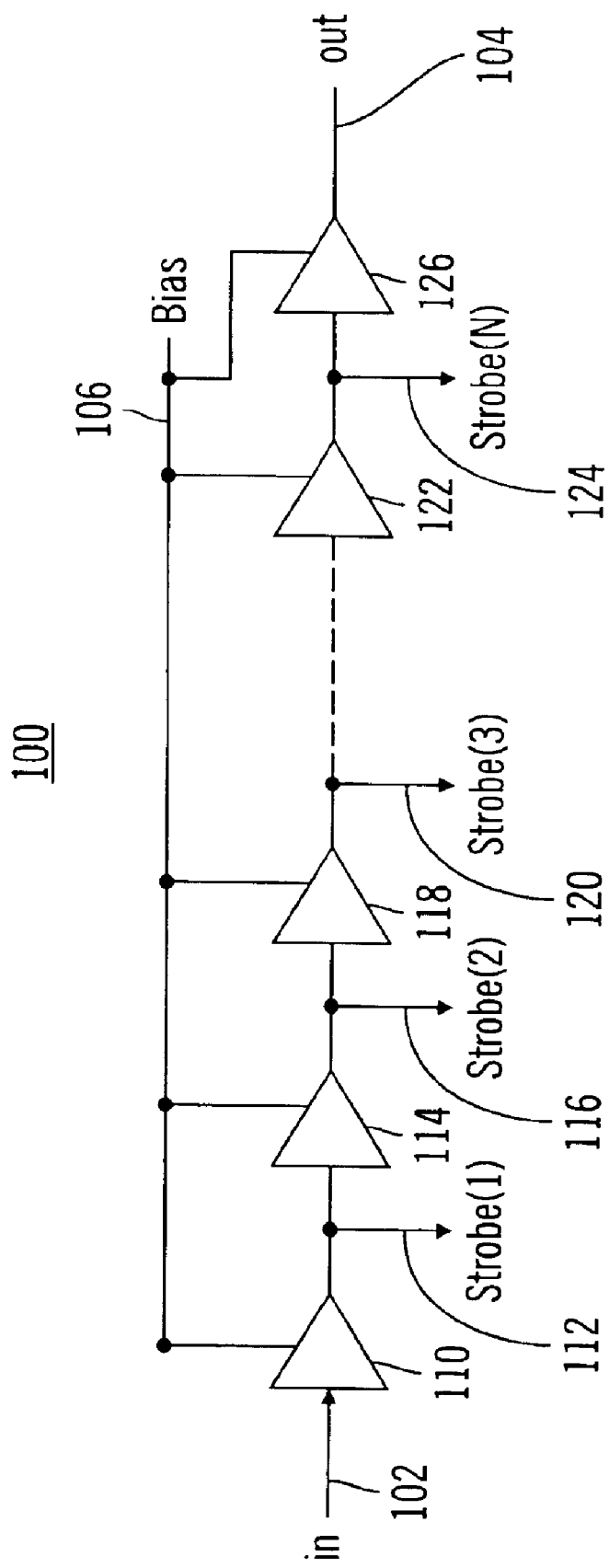
FIG. 1, which has already been described, is a circuit block diagram showing a conventional delay line architecture.
Figure 2:
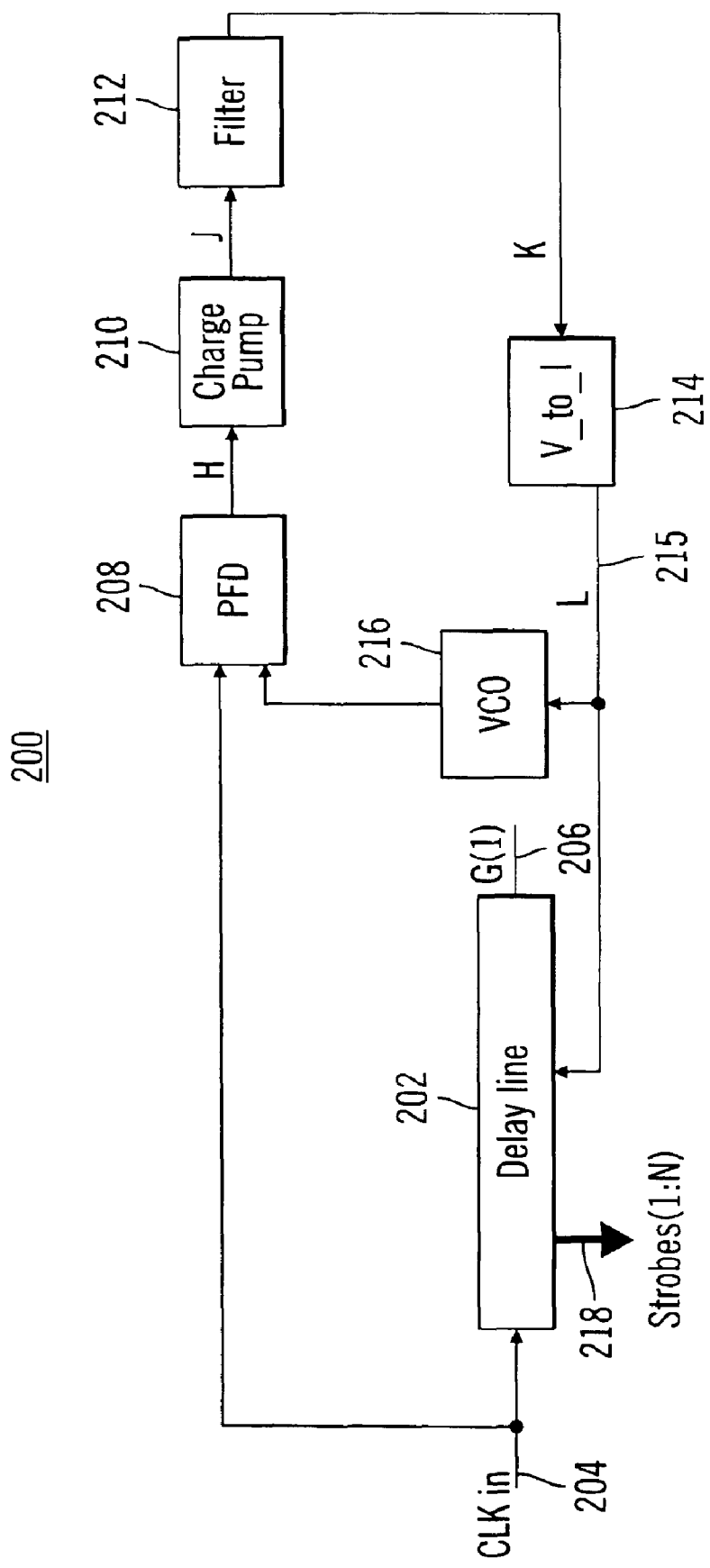
FIG. 2, which has already been described, is a circuit block diagram showing a conventional open loop delay line circuit architecture.
Figure 3:
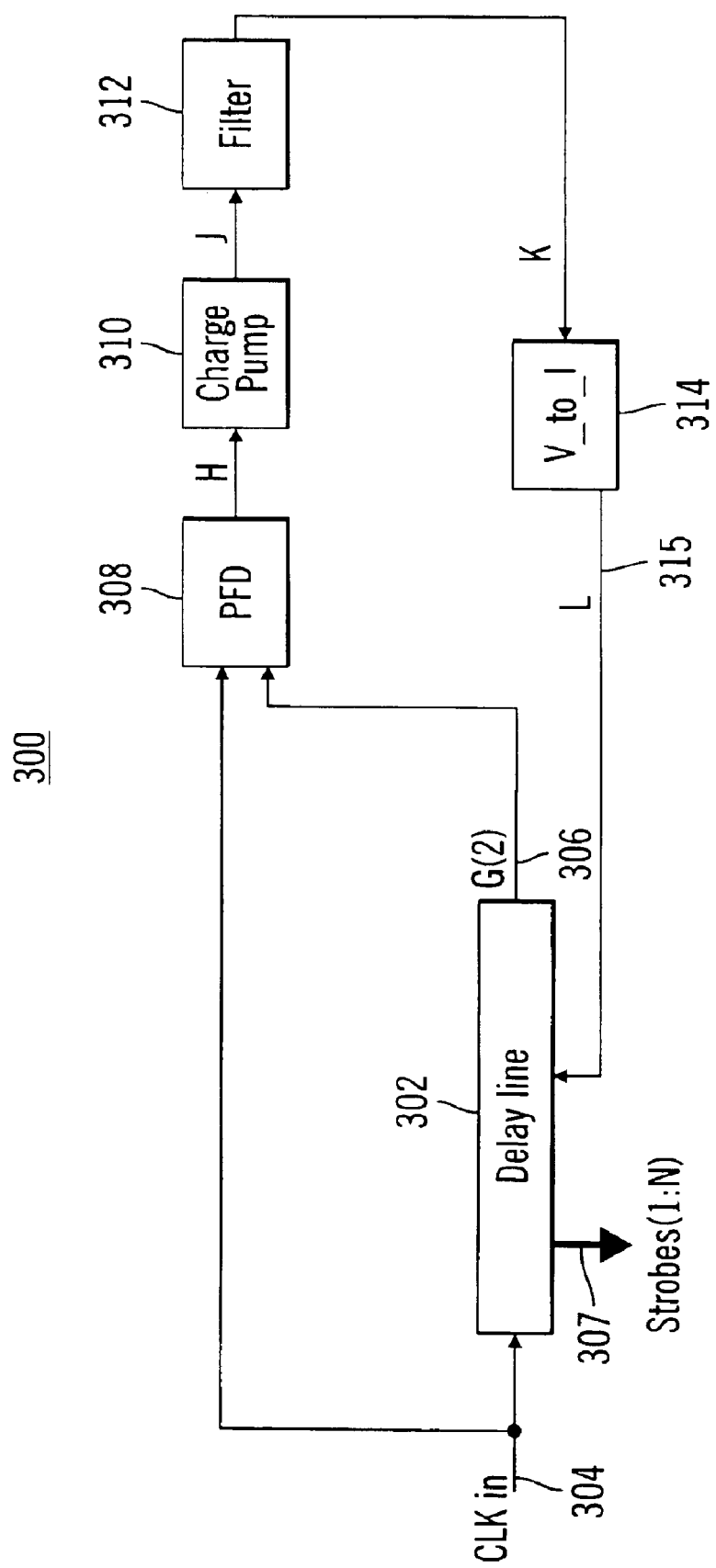
FIG. 3, which has already been described, is a circuit block diagram showing a conventional closed loop delay line circuit architecture.
Figure 7:
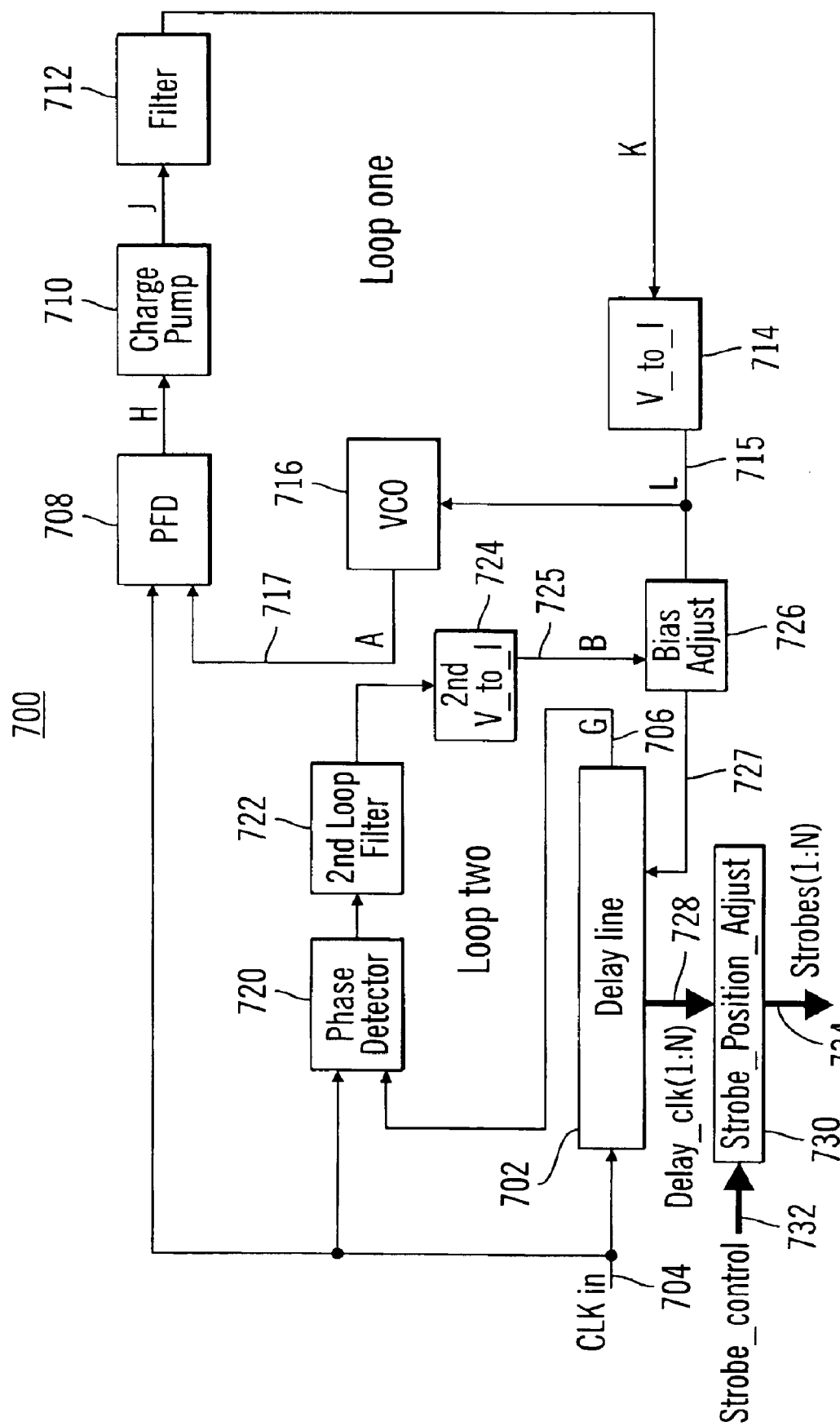
FIG. 7 is a circuit block diagram illustrating a closed loop delay line architecture in accordance with a preferred embodiment of the present invention.

Referring to FIG. 7, a preferred embodiment of the present invention comprises a closed loop delay line architecture 700 that provides superior bandwidth performance and high accuracy data recovery. Conventional delay line architectures, as has been discussed above, have either inherent start up problems or strobe accuracy problems. According to a preferred embodiment of the present invention, a precision closed loop delay line architecture solves the problems with the prior art as will be discussed in more detail below. Note that preferred embodiments of the present invention may be implemented generally in any circuit supporting substrates such as in integrated circuits and in electronic circuit boards, and also in all forms of electronic devices and equipment, as may be appreciated by those of ordinary skill in the art in view of the present discussion.

A precision delay line architecture 700, as shown in the example in FIG. 7, obtains highly reliable clock recovery over a wide frequency bandwidth while achieving a low Bit Error Rate (BER) for recovered data signals. Five additional circuit components 720, 722, 724, 726, and 730, interoperate with the delay line 702 to provide a second feedback loop and additional adjustability of signals, as will be discussed below.

The function of the closed delay loop architecture 700 is significantly improved over any known prior art delay loop architecture. Instead of one loop, this new architecture 700 consists of two functional loops. The first loop consists of the Phase Frequency Detector PFD 708, the Charge Pump 710, the Filter (comprising a low pass filter) 712, the Voltage-to-Current Converter V_to_I 714, and the Voltage Controlled Oscillator VCO 716. The second loop consists of the Delay Line 702, the Phase Detector 720, the 2nd Loop Filter (comprising a low pass filter) 722, the second Voltage-to-Current Converter 2nd V_to_I 724, and the Bias_Adjust circuit 726. Additionally, a Strobe_Position_Adjust circuit block 730 is located at the output of the Delay Line strobe outputs 728, which is the output of the second loop.

The first loop 708, 710, 712, 714, and 716, comprises a phase lock loop that adjusts a current signal at the output 715 of the Voltage-to-Current Converter 714, at point L, based on the PFD 708 comparing a signal from the Clock in input 704 to a signal from the output 717 of the VCO 716. Due to this new architecture 700, a phase error introduced in the first loop due to frequency, power supply, temperature, and process can be neglected. The current signal at the output 715 of the Voltage-to-Current Converter 714, at point L, provides a bias current, at the input 727 of the Delay Line 702 that adjusts the speed of operation of the delay line elements. The bias current at the input 727 of the Delay Line 702 is provided by a Bias Adjust circuit 726 that combines the bias current output 715 of the Voltage-to-Current Converter 714 with the current signal at the output 725 of the second Voltage-to-Current circuit 724 that is part of the second loop. Because only the bias current information is passed over from the first loop to the second loop, as long as the first loop is locked to the input clock frequency at the Clock in line 704, the bias current at the input 727 of the Delay Line 702 is set to the correct value. The second loop continuously adjusts the current signal at the output 725 of the second Voltage-to-Current circuit 724 to combine in the Bias Adjust circuit 726 with the current signal from the output 715 of the Voltage-to-Current Converter 714.

The second loop combines the bias current from the output 715 of the Voltage-to-Current 714 of the first loop via the Bias Adjust circuit block 726. In the second loop, the Phase Detector circuit block 720 compares the phase difference between the input clock signal at the input 704 and output signal at the output 706 of the delay line 702. The current signal at the output 725 of the second Voltage-to-Current Converter 724 provides an adjustment current signal into the Bias Adjust circuit block 726. This adjustment current signal is very responsive to the slight variations of the timing of the delay elements of the Delay Line 702. It provides quick feedback via the Bias Adjust circuit block 726 to adjust the timing of the Delay Line 702. The adjustment current signal at the output 725 of the second Voltage-to-Current Converter 724 can quickly increase or decrease the bias current at the input 727 of the Delay Line 702 and thereby quickly adjust the speed of the delay line elements to track the speed of the Clock in signal at the input 704 of the Delay Line 702. A delay line system according to a preferred embodiment of the present invention, therefore, provides a close tracking of an input clock signal at the input 704 by use of the two loops. The first loop locks in to, and closely tracks, the wide band frequency adjustment of the clock in signal, while the second loop is very responsive to adjustments of the signal timing due to the delay line 702. This is an important advantage of the present invention that is not found in known prior art delay line systems.

Figure 9:
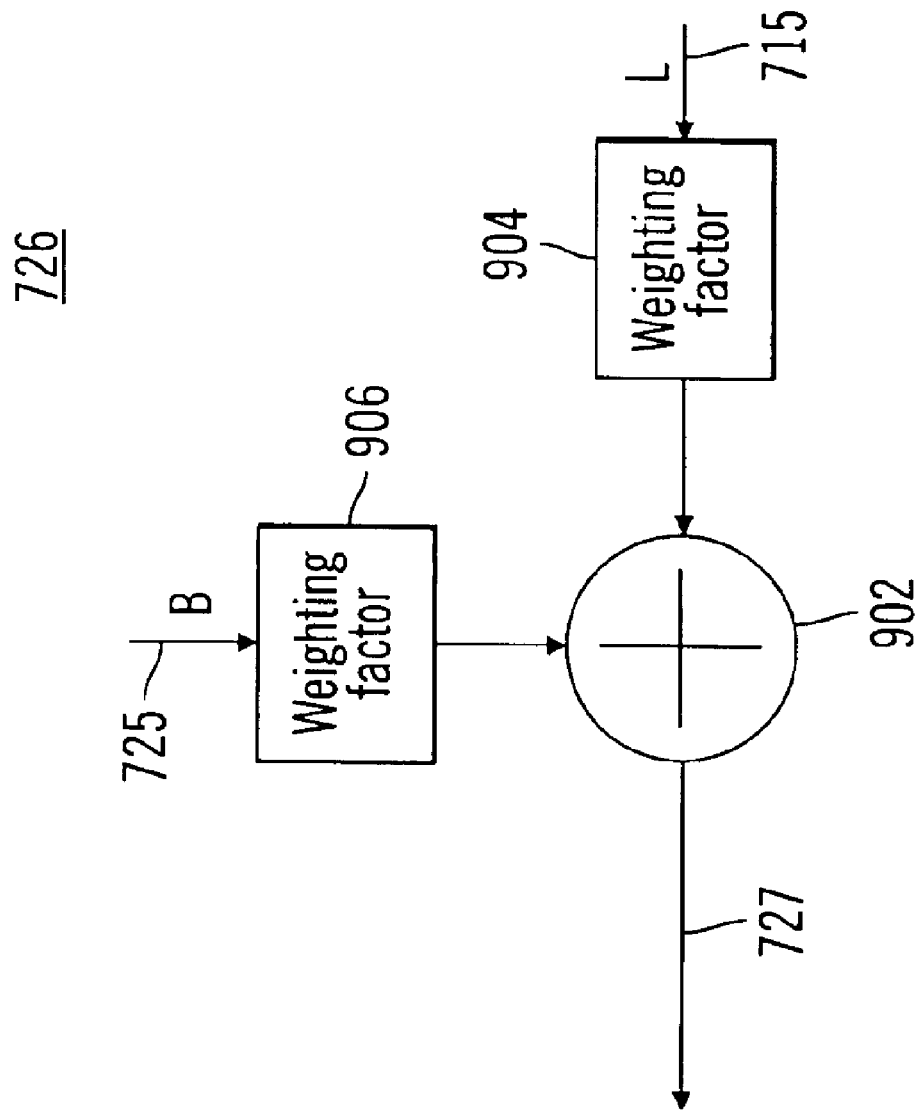
FIG. 9 is a circuit block diagram illustrating a more detailed view of a bias adjust circuit component shown in FIG. 7, according to a preferred embodiment of the present invention.

Referring to FIGS. 7 and 9, the Bias Adjust circuit block 726 will be discussed in more detail below. The Bias Adjust circuit block 726 comprises a mixer circuit 902. It takes inputs from the output 715 of the Voltage-to-Current converter 714, at point L, and the output 725 of the second Voltage-to-Current Converter 724, at point B. These inputs 715, 725, are first passed through respective weighting factor circuit blocks 904, 906, that adjust the level of current signal passed on to the mixer (current combining) circuit 902. The weighting factor circuit blocks 904, 906, preferably comprise transistor circuits with resistor ladders arranged in current mirror topology to allow a portion of the respective input current signal to pass on to the mixing circuit 902. According to the present example, the output 715 of the Voltage-to-Current converter 714, at point L, passes to a weighting factor circuit block 904 that allows about 95% of the input current signal to pass to the mixing circuit 902. The output 725 of the second Voltage-to-Current Converter 724, at point B, passes to a weighting factor circuit block 906 that allows about 5% of the input current signal to pass to the mixing circuit 902. In this way, according to the present example, most of the bias current signal into the Delay Line 702 is from the first loop's Voltage-to-Current Converter 714, while a smaller portion of the bias current signal into the Delay Line 702 is from the second loop's Voltage-to-Current Converter 724. In this way, the Bias Adjust circuit block 726 maintains the Delay Line circuit 702 to run very near the frequency of the VCO 716. With the B input 725 to the Bias Adjust circuit 726, the Delay Line 702 can more precisely adjust the output signal of the Delay Line 702 to match the frequency of the signal from the VCO 716. Hence, the signal at the B input 725 compensates the matching differences between VCO 716 and the Delay Line circuit 702.

The Phase Detector 720, according to a preferred embodiment of the present invention, can be made of a digital circuit. The setup and hold time of this Phase Detector 720 is preferably tweaked down to zero to have low phase error. Since there is no frequency component needed in the operation, this digital Phase Detector 720 can have very high accuracy to precisely place the strobe signals at the Delay clock outputs 728 of the Delay Line 702 in the designed positions.

The first loop provides a loop locked with the input clock signal, at the input 704 to the Delay Line 702, and generates the bias for the VCO 716 and for the Delay Line 702. Since there typically are mismatches in the process, the Delay Line 702 may run at a different speed than the VCO 716. The second loop can fine tune the Bias current to the Delay Line 702 and keeps the Delay Line 702 in the correct speed to provide accurate strobe positions at the Delay clock outputs 728. Of course, due to there being two loops in the system 700, stability issues should be carefully analyzed for a particular implementation.

Figure 8:
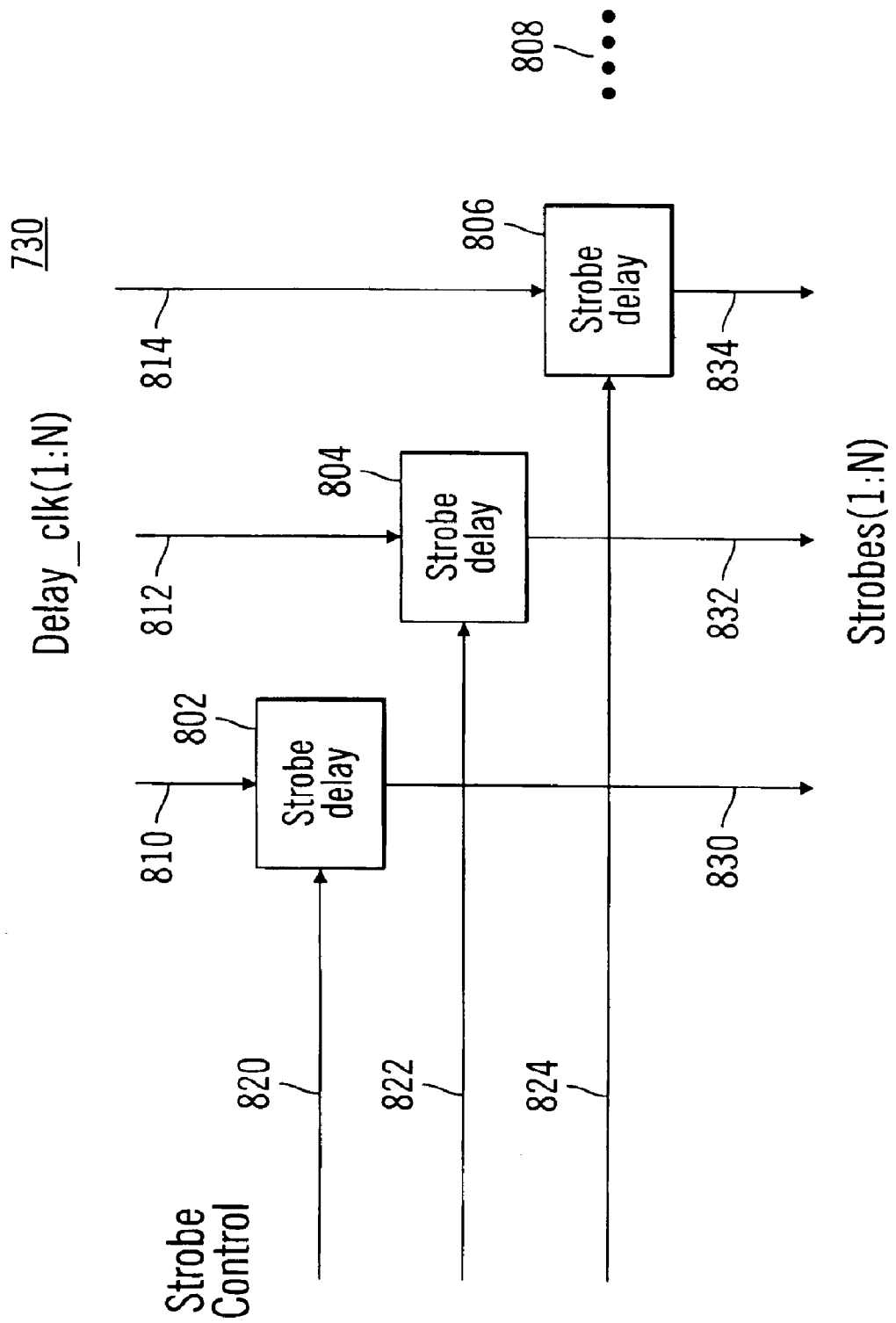
FIG. 8 is a circuit block diagram illustrating a more detailed view of a strobe position adjust circuit component shown in FIG. 7, according to a preferred embodiment of the present invention.

Although the strobe positions at the Delay clock outputs 728 are designed to accurately run very near the frequency of the VCO 716, a preferred embodiment of the present invention includes a Strobe Position Adjust circuit block 730 to resolve any mismatch between the individual delay elements within the Delay Line 702. This adjustment can, for example, evenly distribute the individual strobe signal outputs over the time period between the clock input 704 and the output 706 of the Delay Line 702. With the adjustment signals from the Strobe control 732, each of the Delay_clk (1:N) can be adjusted individually for faster or slower positions to further fine tune the strobe positions to achieve high precision clock recovery. As can be seen in FIG. 8, a more detailed view of the Strobe Position Adjust circuit block 730 is shown. Each Delay Clock line output 810, 812, 814, 808, from the Delay Line 702 is electrically coupled to a strobe delay circuit block 802, 804, 806, 808, that is controlled by a Strobe Control line 820, 822, 824. Note that only three exemplary strobe delay circuit blocks 802, 804, 806, are shown. Additional strobe delay circuit blocks would be included in the Strobe Position Adjust circuit block 730 to match additional Delay Clock outputs from the Delay Line 702, as suggested by the symbol 808. The outputs 830, 832, 834, 808, of the strobe delay circuit blocks 802, 804, 806, 808, provide the adjusted Strobes (1:N) output signals. The strobe delay circuit blocks 802, 804, 806, 808, preferably comprise current controlled buffers that are controlled by the Strobe Control inputs 820, 822, 824. The delay of each current controlled buffer is individually controlled by a current signal provided by a respective Strobe Control input 820, 822, 824. As an alternative preferred embodiment, the strobe delay circuit blocks 802, 804, 806, 808, can comprise controlled load devices to provide varying delays for the adjusted Strobes (1:N) output signals 830, 832, 834. The controlled load devices would be controlled by the Strobe Control inputs 820, 822, 824. For example, a controlled load device may comprise a variable capacitor located at an output of a buffer circuit. In this way, the individually adjusted strobes, from the strobe outputs 728 of the Delay Line 702, can be corrected for individual mismatches between delay elements in the Delay Line 702. This can allow, for example, adjustment of strobe timing to more even distribute strobes over the time period from Clock input 704 to the Delay Line output 706. This combination of very accurate timing of strobes and relative adjustment of strobe positions provides a significant advantage over prior art delay line systems.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method comprising the steps of:
   generating a first current signal associated with a phase comparison of a phase lock loop between a clock in signal and a VCO signal;
   continuously generating a second current signal associated with a phase comparison between the clock in signal and a delay line output signal;
   mixing the first current signal and the second current signal resulting in a combined current signal; and
   providing the combined current signal to a bias input of the delay line to adjust the speed of at least one delay line element in the delay line thereby adjusting the relative timing position of the delay line output signal from the delay line.

2. The method of claim 1, further comprising the steps of:
   weighting the first current signal by about 95% of its value;
   weighting the second current signal by about 5% of its value; and
   wherein the mixing step mixes the weighted first current signal and the weighted second current signal resulting in the combined current signal.

3. The method of claim 1, further comprising the steps of:
   providing a plurality of strobe output signals from the delay line; and
   adjusting the individual timing positions of each of the strobe output signals.

4. An electronic system comprising:
   a timing signal input for receiving a timing signal;
   a phase lock loop, electrically coupled to the timing signal input, and providing a phase lock loop output signal associated with the timing signal;
   a delay line comprising a clock input, a delay line output, and a delay line bias input, a bias signal provided to the delay line bias input adjusting the speed of at least one delay line element in the delay line thereby adjusting the relative position of a timing output signal at the delay line output relative to the timing signal at the clock input into the delay line;
   a bias adjust circuit comprising a first bias input and a second bias input, signals from the first and second bias inputs being mixed and electrically coupled to a bias output of the bias adjust circuit; and
   a phase detector circuit comprising first and second phase detection inputs and a phase detection output for coupling a phase compare signal from the phase detector circuit to the first bias input, the phase compare signal being based on the compared phase between signals at the first and second phase detection inputs, and wherein the first timing signal input and the delay line output are electrically coupled to the first and second phase detection inputs, and wherein the phase lock loop output signal is electrically coupled to the second bias input, the bias output of the bias adjust circuit being electrically coupled to the delay line bias input to provide a bias signal to the delay line.

5. The electronic system of claim 4, wherein the delay line further comprises strobe outputs, and wherein the electronic system further comprises a strobe position adjusting circuit that adjusts the timing position of the strobe signals from the strobe outputs.

6. The electronic system of claim 5, wherein the strobe position adjusting circuit comprises at least one current controlled buffer electrically coupled to at least one strobe output of the delay line for controlling the timing position of the strobe signals from the at least one strobe output.

7. The electronic system of claim 6, wherein the at least one current controlled buffer controllably adds timing delay to the strobe signals from the at least one strobe output.

8. The electronic system of claim 5, wherein the strobe position adjusting circuit comprises at least one controlled load device electrically coupled to at least one strobe output of the delay line for controlling the timing position of the strobe signals from the at least one strobe output.

9. The electronic system of claim 4, wherein the phase lock loop provides a phase lock loop output signal that comprises a first current signal, and wherein the phase compare signal comprises a second current signal, and the bias adjust circuit mixing the first current signal and the second current signal to provide the bias signal from the bias output of the bias adjust circuit to the bias input of the delay line.

10. The electronic system of claim 9, wherein the bias signal comprises a third current signal.

11. The electronic system of claim 10, wherein the bias adjust circuit comprises a first weighting factor circuit electrically coupled to the first bias input, and wherein the bias adjust circuit comprises a second weighting factor circuit electrically coupled to the second bias input, the bias adjust circuit mixing a weighted factor of the first current signal based on the first weighting factor circuit and a weighted factor of the second current signal based on the second weighting factor circuit to provide the third current signal.

12. The electronic system of claim 11, wherein the weighted factor of the first current signal is about 95% of the first current signal, and wherein the weighted factor of the second current signal is about 5% of the second current signal.

13. The electronic system of claim 4, wherein the delay line further comprises a plurality of strobe outputs, and wherein each of the plurality of strobe outputs is electrically coupled to a current controlled buffer for controlling the timing position of strobe signals from each of the plurality of strobe outputs.

14. The electronic system of claim 13, wherein the current controlled buffer coupled to each of the plurality of strobe outputs controllably adds timing delay to the strobe signals from each of the plurality of strobe outputs.

15. The electronic system of claim 4, wherein the delay line further comprises a plurality of strobe outputs, and wherein each of the plurality of strobe outputs is electrically coupled to a controlled load device for controlling the timing position of strobe signals from each of the plurality of strobe outputs.

16. An integrated circuit comprising:
a circuit supporting substrate; and
an electronic circuit coupled to the circuit supporting substrate, the electronic circuit comprising:
a timing signal input for receiving a timing signal;
a phase lock loop, electrically coupled to the timing signal input, and providing a phase lock loop output signal associated with the timing signal;
a delay line comprising a clock input, a delay line output, and a delay line bias input, a bias signal provided to the delay line bias input adjusting the speed of at least one delay line element in the delay line thereby adjusting the relative position of a timing output signal at the delay line output relative to the timing signal at the clock input into the delay line;
a bias adjust circuit comprising a first bias input and a second bias input, signals from the first and second bias inputs being mixed and electrically coupled to a bias output of the bias adjust circuit; and
a phase detector circuit comprising first and second phase detection inputs and a phase detection output for coupling a phase compare signal from the phase detector circuit to the first bias input, the phase compare signal being based on the compared phase between signals at the first and second phase detection inputs, and wherein the first timing signal input and the delay line output are electrically coupled to the first and second phase detection inputs, and wherein the phase lock loop output signal is electrically coupled to the second bias input, the bias output of the bias adjust circuit being electrically coupled to the delay line bias input to provide a bias signal to the delay line.

17. The integrated circuit of claim 16, wherein the delay line further comprises strobe outputs, and wherein the integrated circuit further comprises a strobe position adjusting circuit that adjusts the timing position of the strobe signals from the strobe outputs.

18. The integrated circuit of claim 17, wherein the strobe position adjusting circuit comprises at least one current controlled buffer electrically coupled to at least one strobe output of the delay line for controlling the timing position of the strobe signals from the at least one strobe output.

19. The integrated circuit of claim 18, wherein the at least one current controlled buffer controllably adds timing delay to the strobe signals from the at least one strobe output.

20. The integrated circuit of claim 17, wherein the strobe position adjusting circuit comprises at least one controlled load device electrically coupled to at least one strobe output of the delay line for controlling the timing position of the strobe signals from the at least one strobe output.

21. The integrated circuit of claim 16, wherein the phase lock loop provides a phase lock loop output signal that comprises a first current signal, and wherein the phase compare signal comprises a second current signal, and the bias adjust circuit mixing the first current signal and the second current signal to provide the bias signal from the bias output of the bias adjust circuit to the bias input of the delay line.

22. The integrated circuit of claim 21, wherein the bias signal comprises a third current signal.

23. The integrated circuit of claim 22, wherein the bias adjust circuit comprises a first weighting factor circuit electrically coupled to the first bias input, and wherein the bias adjust circuit comprises a second weighting factor circuit electrically coupled to the second bias input, the bias adjust circuit mixing a weighted factor of the first current signal based on the first weighting factor circuit and a weighted factor of the second current signal based on the second weighting factor circuit to provide the third current signal.

24. The integrated circuit of claim 23, wherein the weighted factor of the first current signal is about 95% of the first current signal, and wherein the weighted factor of the second current signal is about 5% of the second current signal.

25. The integrated circuit of claim 16, wherein the delay line further comprises a plurality of strobe outputs, and wherein each of the plurality of strobe outputs is electrically coupled to a current controlled buffer for controlling the timing position of strobe signals from each of the plurality of strobe outputs.

26. The integrated circuit of claim 25, wherein the current controlled buffer coupled to each of the plurality of strobe outputs controllably adds timing delay to the strobe signals from each of the plurality of strobe outputs.

27. The integrated circuit of claim 16, wherein the delay line further comprises a plurality of strobe outputs, and wherein each of the plurality of strobe outputs is electrically coupled to a controlled load device for controlling the timing position of strobe signals from each of the plurality of strobe outputs.

* * * * *